United States Patent [19]

Zingrini et al.

[11] 4,371,083
[45] Feb. 1, 1983

[54] UNIVERSAL RACK FOR HOUSING TELECOMMUNICATION EQUIPMENT

[75] Inventors: Carlo Zingrini, Milan; Maurizio Oreglio, Bellinzago Lombardo, both of Italy

[73] Assignee: Telettra-telefonia Elettronica e Radio S.p.A., Milan, Italy

[21] Appl. No.: 158,292

[22] Filed: Jun. 10, 1980

[30] Foreign Application Priority Data

Jun. 12, 1979 [IT] Italy .................. 23474 A/79

[51] Int. Cl.³ .................................... A47F 7/00
[52] U.S. Cl. ................................ 211/26; 211/187; 361/391
[58] Field of Search .............. 211/26, 157, 208; 108/108, 109, 144, 149; 361/356, 358, 369, 370, 371, 391

[56] References Cited

U.S. PATENT DOCUMENTS 3,346,124 10/1967 Sobel ...................... 211/187 X
3,657,608 4/1972 Leone et al. ................ 361/391 X
3,704,395 11/1972 Hamer et al. ................ 361/391

Primary Examiner—James T. McCall
Assistant Examiner—Robert W. Gibson, Jr.
Attorney, Agent, or Firm—Holman & Stern

[57] ABSTRACT

A rack for housing telecommunication equipment, which consists of metallic uprights and a number of brackets having a base for the subracks and side ribs with a notch engageable on a pin of the upright, is characterized in that the upright (MO') has a U-shaped cross sections, that is comprising a rear base (Z) and two side bodies (CL, CL') extending in the vertical direction, and is provided in the proximity of the free end of said bodies (CL, CL') with a series of inwardly protruding pins or pivot (PE) equally spaced from one another (DI); at their most inner end the ribs (SA, SA') of the brackets (ME') bear vertical strips (ST) on which are drilled from bottom to top a number (n) of holes (BU) and one slit (FR), in addition to the above mentioned semicircular notch (I); the diameter of holes (BU) and notch (I) as well as the width of slit (FR) are slightly larger than the diameter of said pins (PE) inwardly protruding from the side bodies (CL, CL') of upright MO'.

6 Claims, 7 Drawing Figures

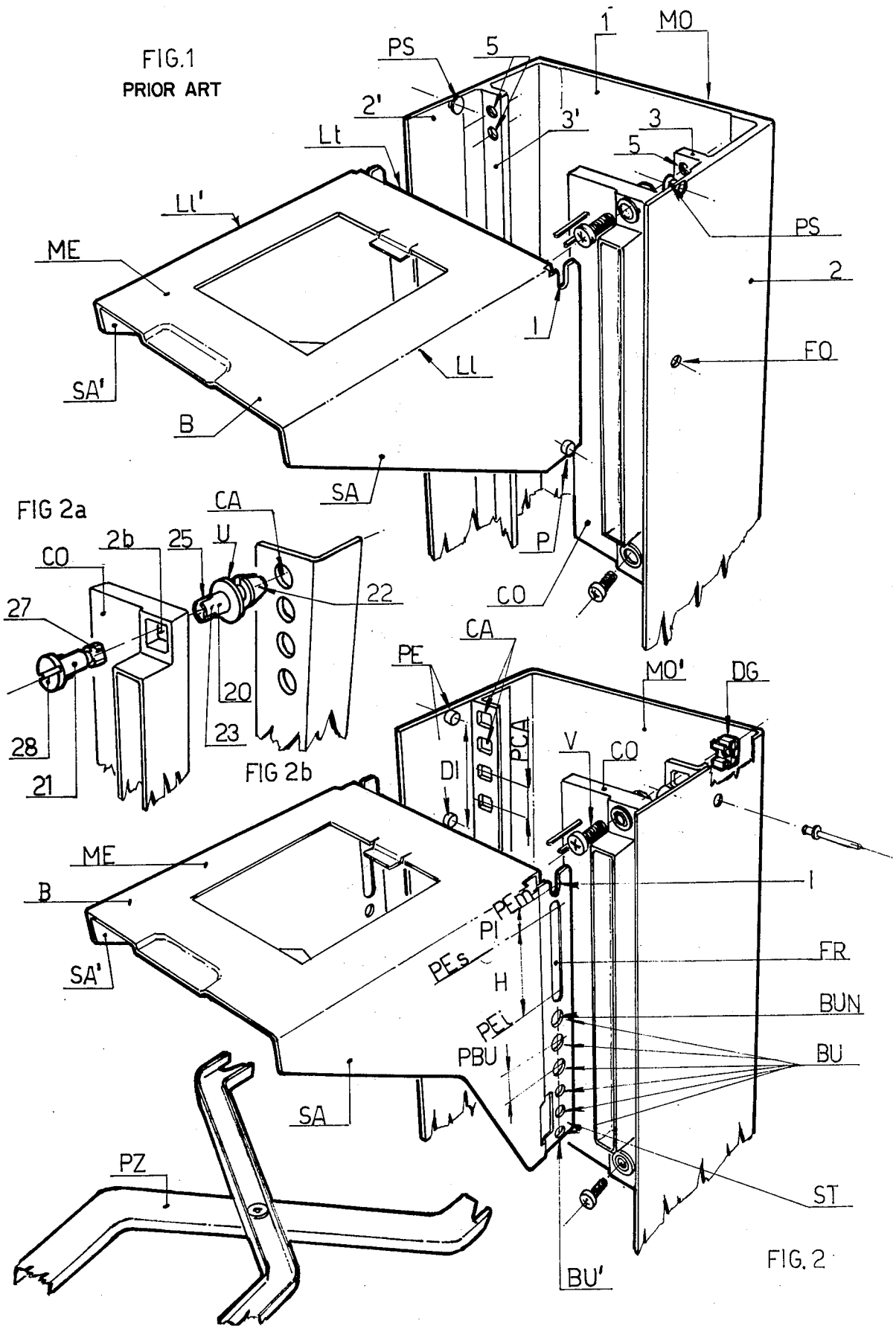

UNIVERSAL RACK FOR HOUSING TELECOMMUNICATION EQUIPMENT

BACKGROUND OF THE INVENTION

1. Field of the Invention

The invention relates to a "universal" rack, that is one capable of housing any combination of standard type subracks containing telecommunication equipment, said rack consisting of at least one metallic upright and a number of brackets which have one horizontal suspension base for the subrack modules and two side ribs and which are adapted to be snap-inserted into said upright.

2. Statement of the Prior Art

So called "slim" racks, that is very narrow ones and hence of little encumbrance, consisting of one upright and a series of brackets arranged on said upright, are known; in conventional racks each side rib of a bracket is shaped as a trapezium with the shorter base shifted to one end, and it has a hole on the portion protruding from the longer side in common with the supporting base of the bracket and one pin near the shorter base.

To fix ideas better and now, FIG. 1 is a schematic partial perspective view of a conventional bracket ME which can be coupled to an upright MO, by snap insertion; to this end, the bracket ME has two side ribs SA, SA' protruding downwards from the longitudinal sides L1–L1' of the suspension base for the subracks (not shown).

Each rib SA has one circular notch I on the upper edge protruding beyond the transverse side Lt of bracket ME, and one outwardly protruding pin P on the lower part or shorter base of the trapezium forming the rib.

Correspondingly, upright MO is made up of two L-shaped elements or, as in FIG. 1, a single C-shaped element consisting of a rear wall 1, two side walls 2–2', and two ledges 3–3' used for supporting connectors CO.

To snap-insert the bracket into the upright MO the latter is provided with one inwardly protruding pin PS and one hole FO on each of the side walls 2—2'.

Pins PS are such as to correspond with the notches I of bracket ME, and holes FO of upright MO are such as to correspond with pins P of bracket ME.

Bracket ME was mounted by engaging the notches I of bracket ME on the upright pins PS and the bracket pins P into the upright holes FO.

In each specific case, that is depending on the composition of the subrack assembly to be mounted, connectors CO were fixed by first drilling and then threading holes 5—5'.

In other words, the connectors could be fixed only by doing on the ledges (originally virgin) some extra-working involving the drilling and threading of holes 5 according to the structural dimensions of the connectors.

Among the main drawbacks of this method, a few are mentioned below;

1. The rack can only house subracks of specified dimensions, which makes the management of rack-codes more difficult;
2. The fixing of connectors involves "a posteriori" operations which are complex and costly (since they also require threading).

Just to furnish a quantitative example, the previous racks could house subracks of the following modular heights: 120, 150, 200, 300, 400 mm.

Excluded from these modules were, for instance, subracks that are very frequently used, such as those with heights of 420, 240, 180 mm and so on.

It should also be noted that, due to the current trend toward miniaturization, the subrack dimensions tend to change constantly so that the need for racks capable of housing the highest possible number of subracks becomes more and more impelling.

Furthermore, said conventional racks were generally made of extruded aluminium.

Among the major disadvantages of extruded-aluminium construction we may mention the following:

1. A specialized structure is required for the construction of different types of racks, which increases management difficulties and very much limits system flexibility.
2. A high cost results especially from the difficulty of mechanizing the drilling and threading operations on this type of rack structure.
3. The bracket-supporting pins, which are made of inox steel, when fitted into the aluminium structure give rise to an intermetallic couple (inox. steel-aluminium) which is incompatible under particular ambient conditions (high humidity, saline fog, etc.).
4. The width of the rack structure does not comply with the probable specifications to be issued by the CEPT, which is oriented toward an installation pitch of 120 mm.

SUMMARY OF THE INVENTION

Primary object of the invention is a rack structure, meant for housing containers of electronic equipment, which will not present the above mentioned inconveniences and will be truly universal in use.

Another object of the invention is a rack which, through the happy choice and combination of materials and structural forms, will implement the actual "optimum optimorum" with regard to the increasingly more impelling requirements imposed on the mechanical parts (whose evolution is very slow) by the electronic parts (rapidly evolving).

These as well as other objects are reached by the rack according to the invention, which consists of one metallic upright and a number of brackets having a horizontal suspension base for the subracks and two side ribs each provided with one notch engageable on a pin protruding from the upright, this latter being also used for supporting the connector blocks; said rack is characterized in that the upright (MO') has a U-shaped cross sections, that is comprising a rear base (Z) and two side bodies (CL, CL') extending in the vertical direction, and is provided in the proximity of the free end of said bodies (CL, CL') with a series of inwardly protruding pins or pivots (PE) equally spaced from one another (DI); at their most inner end the ribs (SA, SA') of the brackets (ME') bear vertical strips (SI) on which are drilled from bottom to top a number (n) of holes (BU) and one slit (FR), in addition to the above mentioned semicircular notch (I); the diametre of holes (BU) and notch (I) as well as the width of slit (FR) are slightly larger than the diametre of said pins (PE) inwardly protruding from the side bodies (CL, CL') of upright MO' the number (n) and spacing (Pbu) of holes (BU) are such that $DI = Pbu\,(n+1)$, while the height H of slit (FR) is such that $$H = DI - 2\,Pbu = (DI - 2)(DI/n + 1);$$

the distance (PI) between PEs and PEm of the pin PE in notch I is made equal to the spacing (Pbu) of holes (BU) so that the sum of height H and height PI is equal to the distance between the first and last holes (BU), that is:

$$H + PI = Pbu \cdot n = DI/(n+1) \cdot n;$$

things are arranged in such a manner that each bracket can assume, over the distance DI between consecutive pins, a number of positions that is equal to the number (n) of holes (BU), the pitch being $PME' = DI/n$, and the subracks that can be mounted in the space between consecutive brackets are all those resulting from the combinations two-by-two of the DI/n positions of each bracket with respect to the following one.

According to one advantageous aspect of the invention, from each side body (CL, CL'), at slightly more internal position than that of the vertical series of fixing pins (PE) for brackets (ME'), there is protruding a short surface (POFA) of a ledge parallel to the base (Z) of upright (MO') wherein a series of holes with pitch equal to DI/n are made which are adapted to receive means for fixing the connectors.

In one particular and preferred embodiment of the invention, the holes on the ledges of the upright side walls consist of unthreaded square or rectangular notches (CA) which house cage bolts into which the connector-fixing screws are inserted.

In another embodiment of the invention the holes in the side ledges are unthreaded holes which accept the female portion of a plastic fastener into which the expanding male portion of the fastener itself is engaged.

According to another notable aspect of the invention, the upright, brackets and ledges are made of inox. steel.

BRIEF DESCRIPTION OF THE DRAWINGS

The various aspects and advantages of the invention will better appear from the particular description of the various embodiments (preferred but not limitative) illustrated by the attached drawings wherein:

FIG. 1 is a partially exploded view, in perspective, of an upright and bracket of the prior art;

FIG. 2 is a partially exploded, perspective view of the upright and bracket of the present invention;

FIG. 2a is an exploded view, in perspective, of an embodiment of a connector of the present invention;

FIG. 2b is an exploded perspective view of a portion of the upright of the present invention;

DETAILED DESCRIPTION OF THE PREFERRED EMBODIMENTS

Figure 3:
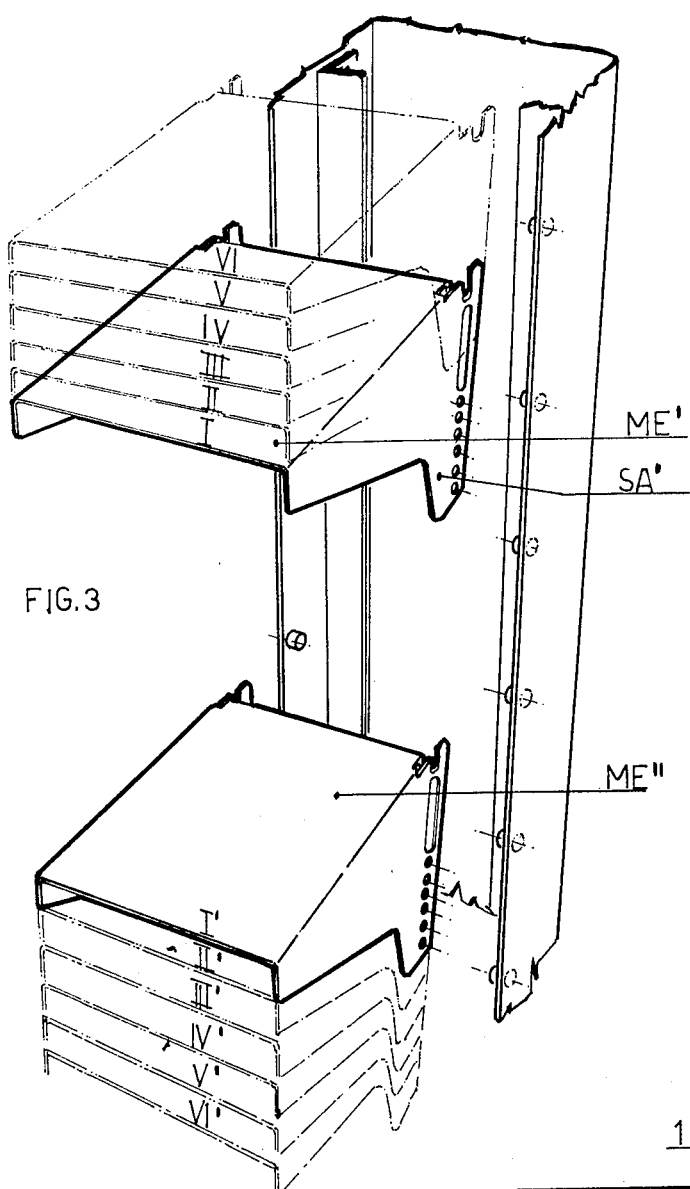
FIG. 3 is a partial exploded view of the upright, carrying two brackets, of the present invention.

The structure of bracket ME' according to the invention, and the corresponding upright MO' are clearly visible in FIGS. 2 and 3. Actually while the base (B) of the bracket according to the invention is not substantially changed with respect to the conventional technique, the side ribs SA' exhibit the following features:

1. There are no more protruding pins, contrary to the known technique where pins P on the side ribs had of necessity to correspond with holes FO on upright MO; on the other hand, in the rack according to the invention all the supporting pins PE are shifted onto the upright MO'; the distance between any two consecutive pins is indicated by DI.

2. However, the brackets ME' according to the invention bear, on the longer and inner edge of ribs SA', the strips ST on which a number (n) of holes BU are made with such a pitch that the distance between the first hole BU' and the last hole BU is equal to the distance $DI - 1/6\ DI$, that is 5/6 DI, where DI is the distance between any two consecutive pins on upright MO'.

3. Above the row of holes BO there is a slit FR wherein pins PE can assume a number of positions equal to $n = n - 2$, these positions being included between a lower position PEi and an upper position PEs, and above the slit FR there is the notch I wherein a pin PE can assume only one position PEm such that the distance PI between PEs (in slit FR) and PEm (in notch I) is again equal to Pbu so that the sum $H + PI$ is equal to the previously mentioned distance between the extremity holes BU' and BUn, that is to $DI - (1/n)\ DI = 5/6\ DI$.

As anticipated, all the pins PE used to support the brackets ME' are fitted into upright MO'.

The spacing between these pins, indicated with DI, is such that DI is equal to $(n+1)$ Pbu, where Pbu is the distance or pitch between any two consecutive holes BU and n is the number of such holes.

The same applies to slit FR whose height H is equal to $DI - 2\ PBU'$ that is to $(n-2)\ PBU'$, the distance PI being equal to the distance between two consecutive holes BU.

In other words the distance DI between pins BE on upright MO' exceeds by 1/n the distance between BU' and BUn, and by 2/n the distance 8 between the extreme positions assumed by the pins within slit FR, n being the number of holes.

Figure 4:
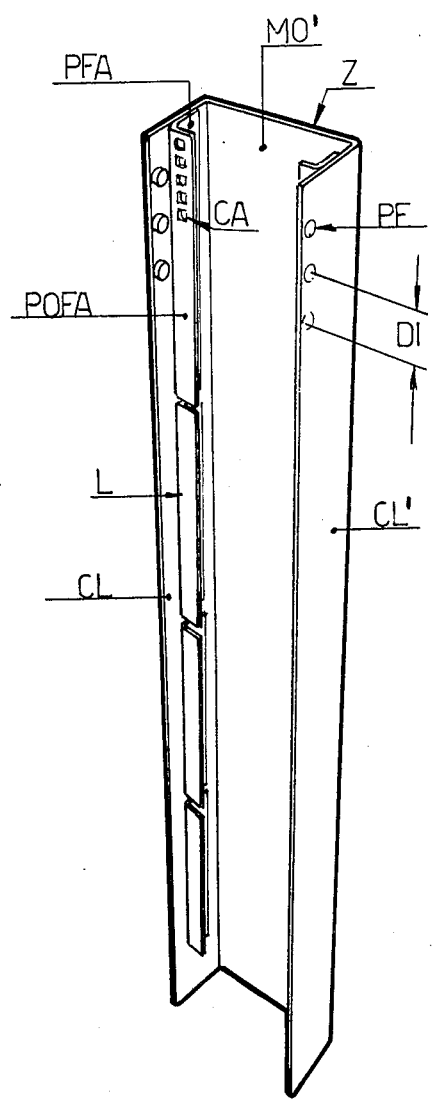
FIG. 4 is a perspective view of an embodiment of the upright of the present invention.

According to another noteworthy aspect of the invention illustrated in FIG. 4, the upright MO' consisting of a rear face Z and two side bodies CL—CL' bears on each side face CL—CL' a certain number of L-shaped pieces of sheet steel which present one part PFA parallel to CL and one part POFA perpendicular to CL; the part POFA has holes or notches whose mutual distance on pitch PCA is preferably such that $PCA = PBU = DI/(n+1)$ where DI is the distance between pins PE and n is the number of holes BU bored on the bracket ribs SA'.

An advantageous embodiment of the invention is clearly shown in FIG. 2, where the notches CA on POFA have square or rectangular shape and accommodate the cage bolts DG which serve to receive the screws V whereby connectors CO are fastened to the L-shaped pieces.

FIGS. 2a and 2b, on the other hand, illustrate another embodiment wherein the notches CA on the L-shaped pieces are circular and connectors CO are fixed by means of a fastener U made up of two parts: part 20 terminates on one end with a wedge 22 which engages into the circular notch CA and bears at the opposite end of 22 a hollow body 23 provided with notches 25.

Once end 22 has been driven into circular notch CA, the hole 26 of connector CO is inserted on the slitted head 23 and connector 26 is fastened by inserting into 26 the part 21 whose inner end 27 terminates into the slitted head 23 whereto it is blocked by turning screw 28 by a few degrees.

Fasteners of this kind had never before been used to fasten connectors in racks for telecommunication equipment.

This is also true of the other embodiment of FIG. 2 in which is envisaged the use of cage bolts DG, per se known but never before used for fastening connectors CO.

These two embodiments of the invention are particularly advantageous in that they eliminate any post-working of the kind largely practiced in the known technique.

Actually, a further advantage of the invention is represented by the fact that uprights MO' as well as brackets ME' and the L-shaped pieces (provided in several separate lengths or as a single part) are now made of inox steel and are fabricated by presswork (forming) of sheet steel whereas the uprights according to the known technique were made of extruded aluminium (and needed numerous post-working operations).

To better fix ideas and make the invention advantages more tangible, it is convenient to consider the specific case of a particularly advantageous embodiment.

With reference to FIG. 3, the distance DI between the pins DE on the side faces CL—CL' of upright MO' has been made equal to 60 mm; with six holes BU (n=6) bored on the strips ST of each rib SA', the distance between the first (lower) hole BU' and the last (upper) hole BUn is equal to 5/6 DI, that is 50 mm, thus PBU=DI/n =6C/6 is equal to 10 mm.

Similarly, since the height of slit FR is H−(n−2) PBU=40 mm and the depth of circular notch I is equal to pitch PBU, that is 10 mm, it results that the sum of the height H of slit FR and the depth of notch I is also equal to 50 mm, that is 5/6 DI, DI being the pitch between pins PE.

It should also be noted that the distance or pitch between consecutive notches CA is preferably equal to the pitch between holes BU of the ribs SA' of the new brackets according to the invention.

With this expedient it is possible to implement configurations such as that illustrated in FIG. 3, that is, bracket ME' may be shifted in steps of 10 mm and the successive bracket ME" may also be shifted in steps of 10 mm and consequently, if bracket ME' is in position I (represented by a solid line) and the successive bracket ME" is in position I', the distance between the two brackets is of 180 mm; by shifting each of the two brackets in steps of 10 mm, it is possible to obtain progressive spacing of 190, 200, 210, 220, 230, 240, 250 mm and so on so that the rack according to the invention is a true universal structure as it can house subracks of any height and in whatever combination.

Figure 5:
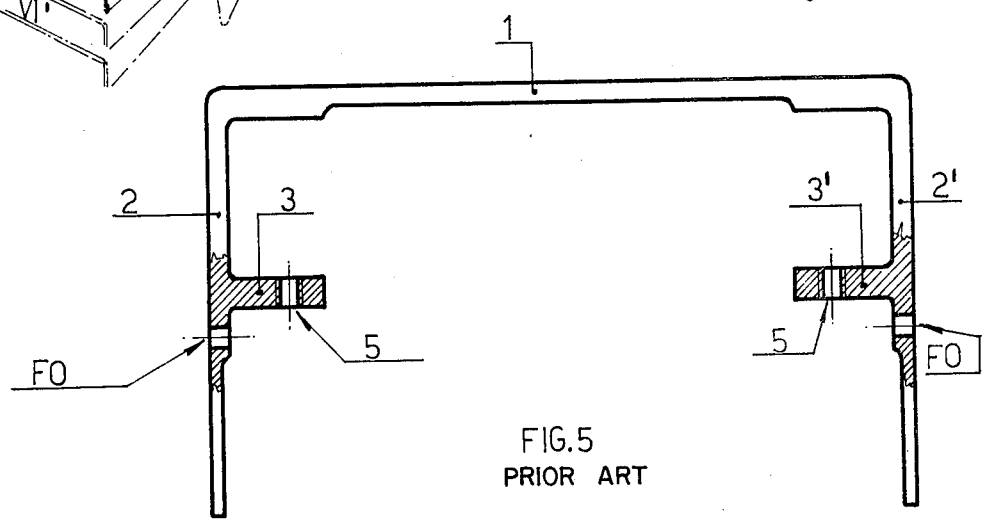
FIG. 5 is a cross-sectional view taken in a plane normal to the longitudinal axis of the upright of FIG. 1.

FIG. 5 shows the new upright 1 according to the known technique, on which it would be necessary to make 504 threaded holes MA (indicated by 5) and 504 holes of 4.1 mm dia in order to achieve the same mounting possibilities offered by the rack according to the invention.

According to a noteworthy aspect of the invention, upright MO', brackets ME' and the internal side ledges of the new rack are made of inox. steel.

Some of the advantages of the inox. steel construction over the traditional extruded-aluminium solution are:

1. By adopting a different conception of the way of locking the brackets to the rack and by providing suitably spaced supporting means, a structure has been implemented which is universal for any rack configuration thus simplifying parts handling and programming.

Said structure can, in fact, accept containers (subracks) having heights variable in 10 mm steps.
2. Even if use is made of more valuable material, the overall cost is lower because the technological solution adopted allows the different parts to be obtained in definitely shorter times.
3. The supporting pins PE are derived by drawing the same material used for the structure (MO'), hence no problems of inter-metallic couples exist.
4. The structure width is compatible with the installation pitch (120 mm) which is likely to be specified by the CEPT.
5. Inevitable slight errors in the position of pins (PE) are now absorbed into (relieved by) slit FR, so that the brackets can be mounted in any case.
6. It has been found that brackets of inox steel can be better inserted or removed by using pliers PZ (FIG. 2) which exert a slight inward pressure on the side ribs; this was not possible with traditional brackets (made of iron coated with a nickel layer) because the pliers would have removed the nickel coating at the areas whereon the pliers tips were acting.
7. The fact must be put in evidence that inox steel is economically convenient even compared with normal steel, as the racks being described involve pieces of considerable dimensions, e.g. 2.6 mm, not only would the surface treatment of these pieces made of normal steel be inherently difficult and complicated, but it could be carried out exclusively by the few Firms possessing the large and expensive shop equipment needed; therefore the cost of such treatment would be high, certainly higher than the savings initially obtained from using normal steel instead of inox steel.

Even neglecting this difficulty, another heavy difficulty remains which is inevitable: since bracket insertion is made by crushing, that is by forcing the upright pin into the bracket hole, if pin and bracket were made of normal steel slacks burrs, etc. would results even upon the first insertion because the friction produced during insertion removes the protective finish so that even rust may occur.

What is claimed is:

1. In a universal rack for housing a wide range of subrack modules containing telecommunication equipment, power supplies and exchange cables, said rack comprising a vertical upright including connectors affixed thereto and at least two brackets, each bracket having a horizontal suspension base for the subrack modules and opposing side ribs each provided with notches for engagement with corresponding pins of the upright, the improvement comprising:

(a) said upright being U-shaped and including a base and two opposing sides extending normal thereto, with the free end of each side including a series of inwardly protruding pins regularly spaced a distance DI apart;

(b) each said bracket rib including, at the end engagable with said corresponding side free end, a vertical strip including an array of N holes in a lower portion thereof, and a slit thereabove, the diameter of said holes and said slit slightly exceeding the diameter of said pins and the number of holes N and the distance PBU between each of said holes being such that $$DI = PBU(N+1)$$

while the distance H between topmost and the bottommost positions in the slit is $$H = DI(1 - 2/N+1);$$

whereby each bracket can assume, over the distance DI, NP positions where NP=DI/N, and the number NM of subrack modules mountable between consecutive brackets are all those resulting from the combinations of the DI/N positions of each bracket on opposing side arms with respect to the successive ones.

2. The universal rack of claim 1 wherein the improvement further comprises
said bracket rib vertical strip having a notch at an upper portion thereof, said array and said slit positioned below said notch; and
the distance from the lowest position in the notch to the uppermost position in the slit being equal to the distance between the holes so that the sum of the length of the slit and the height of the notch is equal to the distance between the first and last holes.

3. The universal rack of claim 1 wherein the improvement further comprises an L-shaped angle piece supported by one side of said upright, said angle piece including a ledge positioned parallel to said upright base and closer to said base than said array of pins supporting said brackets, said ledge including holes therein for receiving means for fixing the connectors thereto.

4. The universal rack of claim 3 wherein said ledge holes comprise unthreaded square notches and said fixing means comprise cage bolts cooperable with fixing screws inserted thereinto.

5. The universal rack of claim 3 wherein said ledge holes comprise unthreaded circular openings into which the female part of a plastic fastener is inserted and the male part of said fastener engages and expands said female part.

6. The universal rack of any one of claims 3, 4 or 5 wherein said upright, said brackets and said ledges are made of inox steel.

* * * * *